United States Patent
Brody et al.

(10) Patent No.: US 6,348,233 B2
(45) Date of Patent: Feb. 19, 2002

(54) METHOD OF FORMING CONDUCTIVE LINE FEATURES FOR ENHANCED RELIABILITY OF MULTI-LAYER CERAMIC SUBSTRATES

(75) Inventors: Jeffrey A. Brody, Hopewell Junction; Harry D. Cox, Rifton; John Garant, Hopewell Junction; Hsichang Liu, Fishkill; Paul G. McLaughlin, Poughkeepsie; Tom Wayson, Owego, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/813,376

(22) Filed: Mar. 21, 2001

Related U.S. Application Data

(62) Division of application No. 09/458,877, filed on Dec. 10, 1999, now Pat. No. 6,127,989.

(51) Int. Cl.[7] .................................................. B05D 5/12
(52) U.S. Cl. ........................ 427/117; 427/97; 427/282; 427/123; 427/126.1; 101/127; 101/129
(58) Field of Search ................................. 427/117, 282, 427/97, 123, 126.1; 101/127, 129; 118/504

(56) References Cited

U.S. PATENT DOCUMENTS

| | | | |
|---|---|---|---|
| 4,323,593 A | * | 4/1982 | Tsunashima ................. 427/97 |
| 4,521,262 A | | 6/1985 | Pellegrino .................... 174/261 |
| 4,543,715 A | | 10/1985 | Ladarola et al. ............. 174/261 |
| 4,551,789 A | | 11/1985 | Schettler et al. ............ 174/262 |
| 4,803,110 A | | 2/1989 | Ahn et al. .................... 428/137 |
| 5,359,928 A | | 11/1994 | Blessington et al. ....... 101/128.4 |
| 5,431,332 A | | 7/1995 | Kirby et al. ................. 228/246 |
| 5,704,535 A | * | 1/1998 | Thompson, Sr. ............. 228/39 |
| 5,742,009 A | | 4/1998 | Hamzehodoost et al. ... 174/256 |
| 5,761,803 A | | 6/1998 | St. John et al. ............. 174/265 |
| 5,784,262 A | | 7/1998 | Sherman ...................... 361/777 |
| 5,875,102 A | | 2/1999 | Barrow ........................ 361/777 |
| 5,888,584 A | * | 3/1999 | Visser-Bartelds et al. ..... 427/96 |

* cited by examiner

*Primary Examiner*—Brian K. Talbot
(74) *Attorney, Agent, or Firm*—Ratner & Prestia; Ira D. Blecker, Esq.

(57) ABSTRACT

A method for minimizing formation of cracks at junctions between conductive vias and conductive lines in line-to-via connections on a substrate. The method comprises providing a transition zone connected between a base section of the line and a cap, the transition zone providing a volume of conductive paste during a conductive paste screen printing operation that is greater than the volume provided by the base section being directly connected to the cap. In particular, the transition zone volume is an effective amount to prevent necking of the conductive line into the via when the mask is misaligned to the substrate within an expected alignment tolerance. The transition zone may comprise a jogged end extending from the base section to the cap at an angle to the line, or a flared end extending from the base section. Line-to-via connection structures, patterns on a mask for making such structures, and masks having such patterns are also disclosed.

9 Claims, 2 Drawing Sheets

METHOD OF FORMING CONDUCTIVE LINE FEATURES FOR ENHANCED RELIABILITY OF MULTI-LAYER CERAMIC SUBSTRATES

This application is a divisional of U.S. patent application Ser. No. 09/458,877, filed on Dec. 10, 1999, now U.S. Pat. No. 6,217,989.

TECHNICAL FIELD

The present invention relates generally to multi-layer ceramic (MLC) substrates and, more specifically, to conductive line features and methods for printing such features to enhance reliability of MLC substrates.

BACKGROUND OF THE INVENTION

Multi-layer ceramic (MLC) substrates, such as are used for chip carriers, comprise a number of discrete ceramic sheets laminated and sintered together. Each sheet has conductive lines printed on its surface with a conductive substance such as a metal, for example, copper paste. Holes punched through the ceramic sheet before sintering of the sheet (the unsintered sheet is known in the art as a "green" sheet) are filled with the conductive paste to provide conductive connections or "vias" between layers of the substrate. Thus, for example, a chip mounted on a completed MLC substrate is electrically connected to an underlying circuit board through the lines and vias of the MLC. Reliable connections in the MLC are critical to achieving the expected performance of the chip; the reliability of the connections is highly dependent upon the integrity of the line-to-via junctions.

Typically, the manufacture of such MLC substrates starts with a glass ceramic powder that is formed into a slurry and cast into a large sheet similar to how a sheet of paper is made. The large cast sheet is then dried and cut into smaller blanks. Via holes are punched into the blanks, and the lines are screen printed onto the blanks using masks and a conductive paste. Then, the layers of the MLC are stacked together and laminated in a press, cut to size, and sintered in an oven to create a homogenous ceramic substrate. One or more terminal plating steps may then be performed, including attaching one or more layers of thin film interconnects on top of the substrate, before joining the chip to the substrate.

Referring now to FIG. 1, there is shown a typical mask 10 known in the art and used to print the conductive lines on the green sheet blanks. Mask 10 comprises line patterns 12 and 13 each having a rectangular base section 14 with a width $w_l$ connected a to circular "cap" section 16 with a diameter $d_c$. Circular cap section 16 is intended to be aligned with a hole punched in the blank, such that the paste flows down into the hole, creating a conductive via. Line pattern 12 has a "jogged" end 15 that is at an angle, typically 90° or 135°, to rectangular base section 14.

Referring now to FIG. 2, there is shown a cross section of a line-to-via connection 20 on a green sheet blank 22 as manufactured using a mask of the prior art such as mask 10 shown in FIG. 1. One known problem, which may be encountered in the creation of such MLC substrates, is that the mask may be misaligned with blank 22 such that the hole punched in the blank for the via 27 is not perfectly centered underneath cap section 16 on mask 10 (shown in FIG. 1). In such case, line-to-via connection 20 between conductive line 24 and conductive via 27 may comprise a necked region 28 within the cap 29.

Cap diameter $d_c$ is typically greater than via diameter $d_v$ and greater than width $w_l$. For example, line 24 may have a width ($w_l$ in FIG. 1) of about 0.071 mm (2.8 mils), via 27 may have a diameter $d_v$ of about 0.089 to about 0.1 mm (about 3.5 to about 4 mil s), and cap 29 may have a diameter dc of about 0.114 to about 0.127 mm (about 4.5 to about 5 mils), whereas the alignment capabilities of the mask to the blank may only provide alignment of the cap to the via within an accuracy of about 0.05 mm (2 mils). Necked region 28 comprises an area having a thickness $t_2$ that is less than the thickness $t_1$ of the remainder of line 24. This thinner area is subject to concentrated thermal fatigue stresses during normal operation of the chip, and may be susceptible to cracking, causing a major reliability problem for the MLC package.

SUMMARY OF THE INVENTION

To achieve this and other objects, and in view of its purposes, the present invention provides a method for minimizing formation of cracks at junctions between conductive vias and conductive lines in line-to-via connections on a substrate. Each line has a base section and a cap. Each cap is positioned over a via in the substrate, the cap diameter being greater than the via diameter.

The method comprises screen printing the conductive lines onto the substrate with conductive paste using a mask that provides a transition zone connected between the base section and the cap. The transition zone provides a volume of conductive paste during printing that is greater than the volume provided by the base section being directly connected to the cap. In particular, the transition zone volume is an effective amount to prevent necking of the conductive lines into the vias when the mask is misaligned to the substrate within an expected alignment tolerance. In one embodiment, the method comprises providing the transition zone with a greater width than the width of the base section.

The invention thus also comprises an improvement in standard conductive line-to-via connections. A standard conductive line-to-via connection comprises a conductive line connected to a conductive via having a via diameter. The standard conductive line has a base section with a first width and a cap with a cap diameter greater Than the via diameter and greater than the first width. The improvement comprises the conductive line having a transition zone between the base section and the cap, the transition zone having a second width greater than the first width. The transition zone may comprise a jogged end extending from the base section to the cap at an angle to the line, or a flared end extending from the base section.

The invention also comprises a line pattern in a screen printing mask for forming such a conductive line on a substrate. The line comprises a base section, a cap adapted to be positioned over a via in the substrate, and a transition zone connected between the base section and the cap. The line pattern has a cap shape adapted to print the cap, a base section shape adapted to print the base section, and a transition shape connected between the base section and the cap and adapted to print a transition zone connected between the base section and the cap. The cap shape has a cap diameter greater than the via diameter. The transition shape has a width greater than the width of the base section shape. The present invention also comprises a screening mask having such a line pattern.

It is to be understood that both the foregoing general description and the following detailed description are exemplary, but are not restrictive, of the invention.

BRIEF DESCRIPTION OF DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF INVENTION

Figure 3:
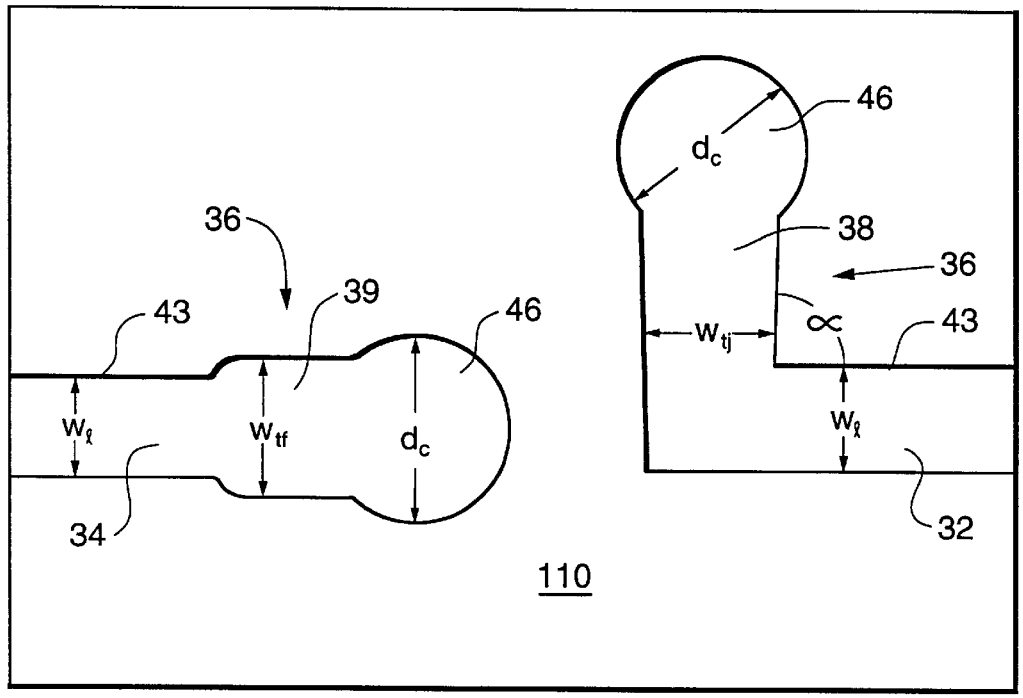
FIG. 3 is a plan view of a mask having exemplary patterns in accordance with the present invention.
Figure 4:
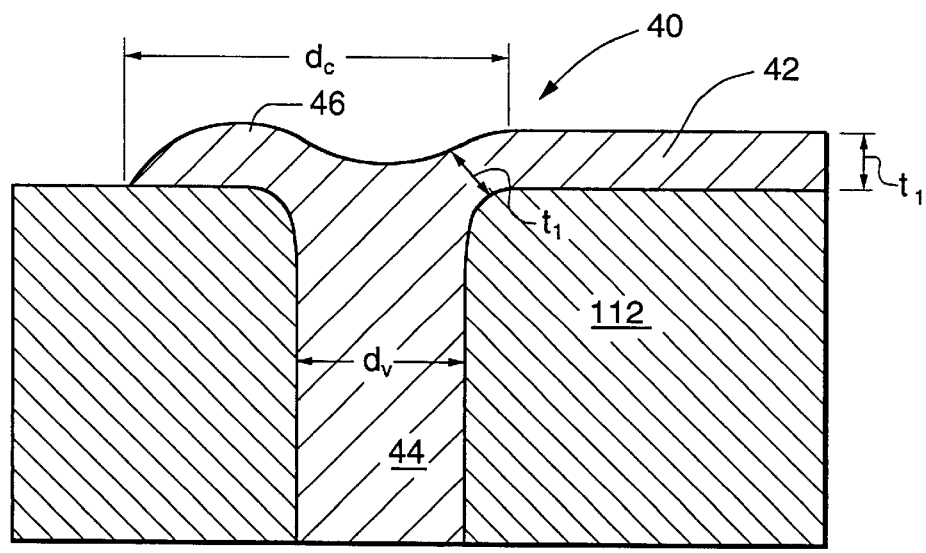
FIG. 4 is a cross-sectional view of an exemplary line-to-via connection created on a blank in accordance with the present invention.

Referring now to the drawing, in which like reference numbers refer to like elements throughout, FIG. 3 shows a plan view of an exemplary mask 110 having patterns 32 and 34. FIG. 4 shows a cross-sectional view of an exemplary blank 112 having a line-to-via connection 40 printed on the blank 112 using patterns similar to those shown in FIG. 3. Because patterns 32 and 34 on mask 110 as shown in FIG. 3 are then transferred to blank 112 as printed lines that resemble patterns 32 and 34 in plan view FIG. 3 is used interchangeably to refer to features of the patterns on the mask as well as features of the lines printed on the blank using the mask. Thus, the reference numbers referring to features of the patterns as shown in FIG. 3 are also used to refer to the actual features of the lines as printed by the patterns. In addition to comprising a method for preventing cracks at junctions between lines and vias, the present invention also comprises line-to-via connection structures, patterns, and masks including such patterns for creating the line-to-via connection structures.

Figure 1:
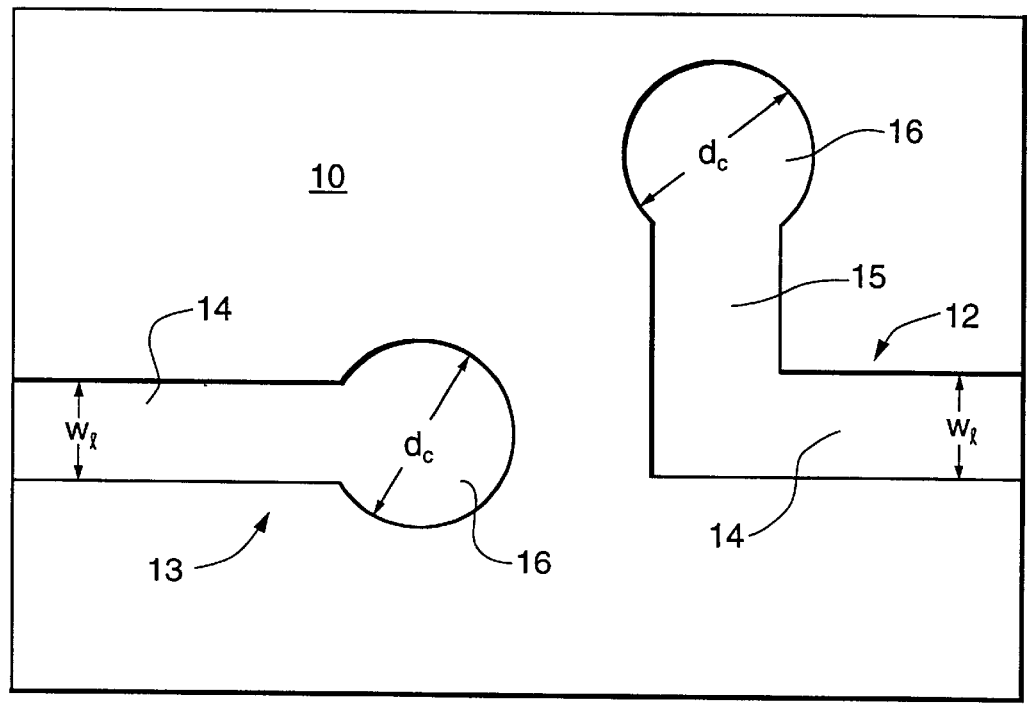
FIG. 1 is a plan view of a mask of the prior art, showing typical patterns used for screen printing lines and vias onto blanks.
Figure 2:
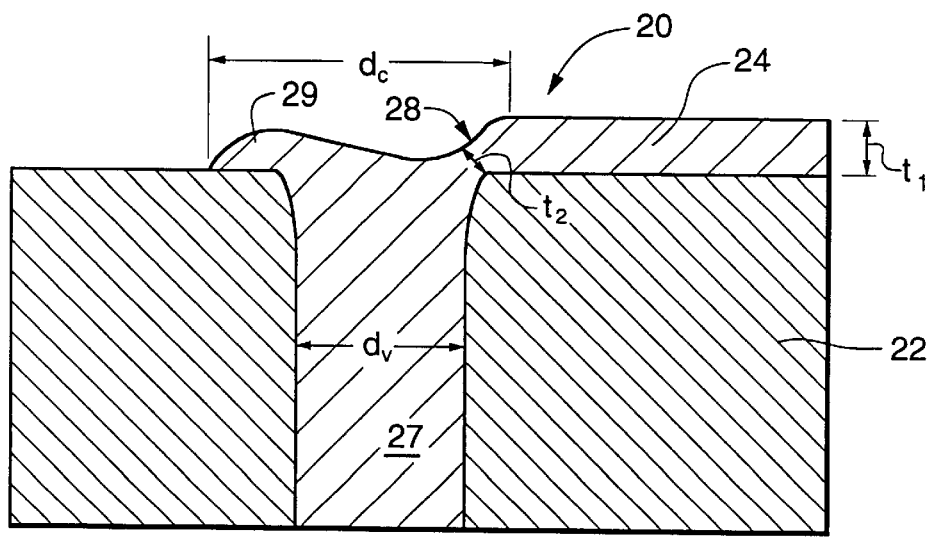
FIG. 2 is a cross-sectional view of a blank of the prior art, showing a line-to-via connection created when a mask such as the mask shown in FIG. 1 is misaligned with the blank during a screen printing step.

To minimize the formation of cracks at junctions between conductive vias and conductive lines in line-to-via connections on a substrate, the present invention comprises screen printing conductive lines 42 onto the substrate or blank 112 using a mask 110 that provides a transition zone 36 connected between the line base section 43 and the cap 46. Transition zone 36 has a geometry sufficient to provide a volume of conductive paste available to fill the via during printing that is greater than the volume of available paste that is provided by the line base being directly connected to the cap, such as is illustrated by base section 14 and cap section 16 in FIG. 1. The volume of the transition zone 36 is specifically an effective amount to prevent necking of conductive line 42 into the via 44 when mask 110 is misaligned to blank 112. "Misaligned" means that the alignment is offset from perfect alignment (where cap 46 is perfectly centered directly over via 44) within the expected tolerances of the alignment process. Thus, when the mask 110 is misaligned within the expected tolerances, transition zone 36 provides an effective amount of conductive paste available to flow into the via 44 to prevent necking.

As shown in FIG. 3, the invention comprises patterns 32 and 34 in a screen printing mask 110 for forming conductive lines 42 on a substrate, as shown in FIG. 4. The substrate is typically a green (unsintered) ceramic blank 112. Each pattern on mask 110 comprises shapes adapted to print corresponding features on blank 112 during a screen printing step using conductive paste. The attributes of the pattern are expressed in terms of the features created by the pattern. For each feature, therefore, there is a corresponding shape in the pattern adapted to print the feature. Each pattern 32 and 34 as shown in FIG. 3 comprises a cap 46 having a diameter $d_c$ greater than the diameter $d_v$ of via 44 in blank 112 (shown in FIG. 4) over which the cap 46 is substantially aligned during printing. Each pattern 32 and 34 also comprises a line base section 43 having a first width $w_l$. A transition zone 36, connected between line base section 43 and cap 46, has a width $w_{tf}$ or $w_{tj}$ that is greater than the base section width $w_l$.

Transition zone 36 may comprise a jogged end 38 extending from the line base section 43 to the cap 46 at an angle α to the base section 43 as illustrated by pattern 32. Angle α may be any angle suitable to achieve the configuration desired, but is typically an angle of 90° or larger, in particular an angle of 90° or 135°. Jogged end 38 has a width $w_{tj}$. For lines not having a jogged end, such as in pattern 34, the transition shape may comprise a flared end 39 extending from line base section 43 to cap 46. Flared end 39 has a width $w_{tf}$.

The result of using patterns 32 or 34 as shown in FIG. 3 is line-to-via connections such as connection 40 shown in cross-section in FIG. 4. Line-to-via connection 40 comprises conductive line 42 connected to conductive via 44. Transition zone 36 between base section 43 and cap 46, as shown in FIG. 3, provides a greater reservoir of conductive paste at the end of the line 42 than without such a transition zone 36. This larger reservoir provides enough paste to fill via 44 while maintaining a thickness of at least $t_1$ at the junction between line 42 and via 44 as shown in FIG. 4. As shown in FIG. 3, transition zones 36 each have a width ($w_{tf}$ or $w_{tj}$) greater than width $w_l$ of base section 43, providing the effectively larger reservoir of paste.

Although in the embodiments illustrated and described above, the transition zone geometry has an intermediate width greater than the line base section width but less than the cap width, other geometries may also be acceptable. For example, the transition zone may include a variable width, such as a width that gradually increases from the line base section width to the cap width. Rather than merely being a different width, the transition zone may have a geometric shape, such as but not limited to a square, rectangle, diamond, circle, semicircle, or oval, superimposed over the line base section connected to the cap. The transition zone preferably has a width less than or equal to the cap width in some portion of the zone. It is advantageous for the transition zone width to be less than or equal to the cap width to optimize the conductor dimensions and prevent oversize conductor features from potentially causing bridging to or shorting of adjacent conductors.

Every transition zone shape must supply an available volume of paste, however, to effectively fill the via without necking—even when the pattern and via are misaligned within predetermined alignment tolerances. Those skilled in the art, given the volumes of the via and the line features as well as the properties of the conductive paste being used, may calculate an effective volume based on the parameters of the individual application, or may derive the effective volume through experimentation. This effective volume may then be translated to a transition zone geometry that provides the available volume of paste to the via.

Although the lines and vias described above may comprise any conductive material, typically the conductive material is a metal, such as copper, lead-tin solder, molybdenum, and tungsten. Also, although described with respect to line-to-via connections on an MLC substrate (typically comprising glass ceramic, alumina, or plastic board), line-to-via connections having the features described above may be useful in other substrate materials. Furthermore, although described with respect to a screen printing process using conductive paste, the method of preventing crack formation at line-via interfaces may be applied to other printing processes for providing lines on substrates that fill holes in the substrate.

EXAMPLES

The following examples are included to more clearly demonstrate the overall nature of the invention. These examples are exemplary, not restrictive, of the invention.

In a standard line-to-via connection 40 as shown in FIGS. 3 and 4, width $w_l$ may be about 0.071 mm (2.8 mils). Cap diameter $d_c$ may be in a range of about 0.114 to about 0.127 mm (about 4.5 to about 5 mils). Via diameter $d_v$ is typically in a range of about 0.089 to about 0.1 mm (about 3.5 to about 4 mils).

For a pattern 32 having a jogged end 38 such as shown in FIG. 3, the width $w_{tj}$ of transition zone 36 maybe about 0.089 to 0.107 mm (about 3.5 to 4.2 mils). The above dimensions for the transition zone 36 also translate to a ratio with respect to the other features. Thus, for $d_c/d_v$ in the range of about 1.1 to about 1.3, $w_{tj}/w_l$ is about 1.25 to 1.5 and $w_{tj}/d_c$ is about 0.8 to about 1.0.

Given the same standard line width $w_l$ and ranges for cap diameter $d_c$ and via diameter $d_v$ above, for a pattern 34 having a flared end 39, width $w_{tf}$ may be about 0.089 to 0.107 mm (about 3.5 to 4.2 mils). Thus, expressed in the form of a ratio, for $d_c/d_v$ in the range of about 1.1 to about 1.3, $w_{tf}/w_l$ is about 1.25 to 1.5 and $w_{tf}/d_c$ is about 0.8 to about 1.0.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. A method for minimizing formation of cracks at junctions between conductive vias and conductive lines in line-to-via connections on a substrate, each line having a base with a width and a cap with a cap diameter, each cap positioned in the substrate over a via with a via diameter less than the cap diameter, the method comprising:

screen printing the conductive lines onto the substrate with conductive paste using a mask that provides a transition zone connected between the base and the cap, the transition zone providing a volume of conductive paste available to fill the via during printing that is greater than a volume of available paste provided by the base being directly connected to the cap, the volume of paste in the transition zone comprising an effective amount to prevent necking of the conductive lines into the vias when the mask is misaligned to the substrate within an expected alignment tolerance.

2. The method of claim 1 comprising providing a transition zone having a greater width than the base width.

3. The method of claim 2 comprising providing a transition zone having a width less than or equal to the cap diameter.

4. The method of claim 1 comprising providing the transition zone with a jogged end extending from the line to the cap at an angle to the line.

5. A method for minimizing formation of cracks at a junction between a conductive via and a conductive line in a line-to-via connection on a substrate, the line having a base with a width, the via having a diameter and a cap surrounding the via, the cap having a diameter greater than the via diameter, the method comprising the step of:

printing the conductive line on a substrate with a conductive material using a mask that provides a transition zone connecting the base and the cap, the transition zone having a greater width than the base width.

6. The method of claim 5 further comprising printing the transition zone with a width lesser than or equal to the cap diameter.

7. The method of claim 5 wherein the step of printing the transition zone comprises printing a jogged end extending from the line to the cap at an angle to the line.

8. The method of claim 7 wherein the step of printing the transition zone comprises printing a flared end extending from the line to the cap.

9. The method of claim 1 comprising providing the transition zone with a flared end extending from the line to the cap.

* * * * *